US006693012B2

(12) United States Patent
Mouli et al.

(10) Patent No.: US 6,693,012 B2
(45) Date of Patent: Feb. 17, 2004

(54) METHOD AND DEVICE TO REDUCE GATE-INDUCED DRAIN LEAKAGE (GIDL) CURRENT IN THIN GATE OXIDE MOSFETS

(75) Inventors: Chandra V. Mouli, Boise, ID (US); Ceredig Roberts, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/034,778

(22) Filed: Dec. 27, 2001

(65) Prior Publication Data

US 2002/0050621 A1 May 2, 2002

Related U.S. Application Data

(62) Division of application No. 09/648,044, filed on Aug. 25, 2000.

(51) Int. Cl.[7] .............................................. H01L 21/425
(52) U.S. Cl. ...................... 438/302; 438/516; 438/525
(58) Field of Search ................................ 438/513–519, 438/549, 556, 558–564, 159, 174, 175, 181, 194, 197, 199, 216, 217, 302, 303–305; 257/408, 402–404, 336, 394, 346, 344

(56) References Cited

U.S. PATENT DOCUMENTS

| | | | |
|---|---|---|---|
| 5,372,957 A | * 12/1994 | Liang et al. ............. | 438/302 X |
| 5,672,525 A | 9/1997 | Pan | |
| 5,684,317 A | 11/1997 | Hwang | |
| 5,719,425 A | 2/1998 | Akram et al. | |
| 5,750,435 A | 5/1998 | Pan | |
| 5,866,460 A | 2/1999 | Akram et al. | |
| 5,920,782 A | 7/1999 | Shih et al. | |
| 5,972,783 A | 10/1999 | Arai et al. | |
| 5,998,274 A | 12/1999 | Akram et al. | |
| 6,030,875 A | 2/2000 | May et al. | |
| 6,091,118 A | 7/2000 | Duane | |
| 6,188,101 B1 | 2/2001 | Wang | |
| 6,238,998 B1 | 5/2001 | Leobandung | |
| 6,242,334 B1 | * 6/2001 | Huang et al. ............. | 438/595 |
| 6,297,098 B1 | 10/2001 | Lin et al. | |
| 6,352,912 B1 | 3/2002 | Brown et al. | |

FOREIGN PATENT DOCUMENTS

WO    WO 99/31732    6/1999

OTHER PUBLICATIONS

Rosenblatt et al., GaAs MESFET Device Dependence on Ion–Implant Tilt and Rotation Angles, IEEE Electronic Device, vol. 9, No. 3, Mar. 1988, pp. 138–141.*
Hori, A 0.1–um CMOS Technology with Tilt–Implant Punchthrough Stopper (TIPS), Electron Devices Meeting, 1994, IEEE 1994, 75–78.*
Cherng et al, Decrease of Gate Oxide Dielectric Constant in Tungsten Polycide Gate Process, IEEE Electron Device Letters. vol. 14. No. 5. May 1993, pp. 243–245.
Pfiester et al., An ITLDD CMOS Process with Self–Aligned Reverse–Sequence LDD/Channel Implantation, IEEE Transaction on Electron Devices, vol. 38, No.11, Nov. 1991, pp. 2460–2464.
Ma, T.P.; Metal–Oxide–Semiconductor Gate Oxide Reliability and the Role of Fluorine; Journal of Vaccume Science & Technology; Jul./Aug. 1992; 705–712; American Vacuum Society; New York.

* cited by examiner

*Primary Examiner*—Wael Fahmy
*Assistant Examiner*—Hoa B. Trinh
(74) *Attorney, Agent, or Firm*—Dinsmore & Shohl LLP

(57) ABSTRACT

A process for the fabrication of an integrated circuit which provides a FET device having reduced GIDL current is described. A semiconductor substrate is provided wherein active regions are separated by an isolation region, and a gate oxide layer is form on the active regions. Gate electrodes are formed upon the gate oxide layer in the active regions. An angled, high dose, ion implant is performed to selectively dope the gate oxide layer beneath an edge of each gate electrode in a gate-drain overlap region, and the fabrication of the integrated circuit is completed.

36 Claims, 4 Drawing Sheets

US 6,693,012 B2

METHOD AND DEVICE TO REDUCE GATE-INDUCED DRAIN LEAKAGE (GIDL) CURRENT IN THIN GATE OXIDE MOSFETS

CROSS REFERENCE TO RELATED APPLICATIONS

This application is a division of U.S. patent application Ser. No. 09/648,044 filed Aug. 25, 2000.

TECHNICAL FIELD

The invention relates to the fabrication of integrated circuit devices, and more particularly, to a method of reducing Gate Induced Drain Leakage (GIDL) current by selectively increasing electrical gate oxide thickness only in the gate/drain overlap region during the fabrication of integrated circuits.

BACKGROUND OF THE INVENTION

In the fabrication of integrated circuits, as the sizes of semiconductor devices, such as state-of-the-art Metal Oxide Semiconductor Field Effect Transistors (MOSFETs), are scaled down, performance issues regarding the current driving capabilities of these devices exist. Since the current driving capability is a function of both source resistance and gate oxide thickness, better performance in these devices is achievable through thinner gate oxide and spacer layers. However, it has been observed that as the gate oxide is made thinner, gate-induced drain leakage (GIDL) currents degrade the performance of these devices as the GIDL currents become a larger percentage of the total sub-threshold leakage current. The GIDL currents are due to electrons from the valence band tunneling to the conduction band as a result of excessive band bending in the gate/drain overlap region. As these semiconductor devices scale down, the layer thickness of the gate oxide must continue to be reduced in order to provide for suitable gate control over the sub-threshold region. Also, doping density in the channel and source/drain regions must increase to improve punch through characteristics and increase drives. Unfortunately, it has been observed that by increasing the doping density in the channel and source/drain regions, the surface electric field also increases, resulting in more band bending and hence, even more GIDL current. Thus, difficulties exist in providing a scaled down semiconductor device having a suitable balance between high current driving capability and low GIDL current.

One approach for reducing GIDL currents involves symmetrical oxidation in order to provide a thick gate oxide only in the regions of the gate-source and gate-drain overlap. The thick gate oxide in the gate-drain region reduces GIDL. However, having a thick gate oxide in the gate-source region increases source resistance, which in turn, reduces the current driving capability of the device.

Another approach is disclosed by U.S. Pat. No. 5,684,317 to Hwang, who teaches forming a thick oxide layer only in the gate-drain region in order to reduce GIDL current without increasing source resistance. The material thickness of the oxide layer in the gate-drain region is increased by implanting an oxidation accelerating material, such as chlorine or fluorine, to physically grow a thicker gate oxide layer in that region. Due to the presence of the oxidation accelerating material, the oxide layer in the gate-drain region grows faster than the remaining portions on the substrate. However, having an increased material thickness of the oxide layer in the gate-drain region hampers current drives of the transistor and also cause increased stress in the active area near the overlap region due to volume expansion.

Accordingly, a need exists for a scaled-down semiconductor device having a thinner gate oxide with improved electrical performance which overcomes the disadvantages of the prior art. The semiconductor device and its method of fabrication should be cost effective and manufacturable, should be easily integrated into an existing process flow, and should not significantly increase the cycle time of the process flow.

SUMMARY OF THE INVENTION

The present invention provides a method by which field effect transistor (FET) devices are produced having lower gate induced drain leakage (GIDLs) than FET devices with a similarly thick gate oxide layer formed by conventionally known methods. The method of the present invention, as explained hereafter, may be used in the fabrication of all N-channel, P-channel, and CMOS FET devices.

The method of the present invention employs a non-orthogonal ion implant process by which the gate-oxide layer in the gate-drain overlap region of a FET device is selectively doped with fluorine or chlorine ions. The dosage of the ion implant is such that the ion concentration increases the 'electrical' gate oxide thickness near the gate-source/drain corners, thereby lowering the dielectric constant of the gate-oxide layer in the gate-drain overlap region without actual thickness growth to the ion doped gate-oxide layer. Since GIDL is exponentially dependent on the magnitude of the surface electrical field, even a slight reduction in the electrical field results in a dramatic reduction in GIDL. Accordingly, supplementing existing FET fabrication processes with the method of the preset invention, lowers the effective surface electrical field in the overlap region, and thereby minimizes GIDL in FET devices wherein the present invention is practiced.

The method of the present invention may be employed in any FET device which is susceptible to increased GIDLs due to a 'thin' gate oxide layer. The method of the present invention may be practiced upon N-MOSFET devices within integrated circuits including but not limited to Dynamic Random Access Memory (DRAM) integrated circuits, Static Random Access Memory (SRAM) integrated circuits, Erasable Programmable Read-Only Memory (EPROM), and Application Specific Integrated Circuits (ASICs). Also, the method of the present invention has broad applicability and may be practiced upon P-MOSFET and CMOS devices within integrated circuits, as the process is applicable to the fabrication of those devices.

In accordance with one aspect of the present invention, provided is a circuit structure comprising a semiconductor layer; an oxide layer formed on the semiconductor layer; a polysilicon layer formed on the oxide layer; a gate structure formed from the polysilicon layer, the gate structure having a defined leading edge; and an overlap region beneath the gate structure and adjacent the leading edge having a predetermined ion implant concentration, the predetermined implant concentration is sufficient to increase the electrical gate oxide thickness in the overlap region.

In accordance with another aspect of the present invention, provided is a method for fabricating a structure on a semiconductor layer comprising the steps of forming an oxide layer on a semiconductor layer; forming a polysilicon layer on the oxide layer; patterning the polysilicon layer into a gate structure having a defined leading edge, and to expose the oxide layer; and implanting ions into the oxide layer at an overlap region beneath the gate structure and adjacent the defined leading edge to a predetermined ion implant concentration which is sufficient to increase the electrical gate oxide thickness only in the overlap region without thickness growth of the oxide layer, the ions being implanted at a tilt angle non-orthogonal to the plane of the semiconductor layer.

In accordance with still another aspect of the present invention, provided is a method of reducing Gate Induced Drain Leakage (GIDL) current within Field Effect Transistors (FETs) comprising the steps of: forming on a semiconductor substrate a field effect transistor structure comprising a gate oxide layer, a gate electrode on the gate oxide layer and two source/drain regions formed within the semiconductor substrate; annealing the semiconductor substrate; implanting ions into the gate oxide layer beneath the gate electrode and adjacent the drain region, which defines an overlap region, to a predetermined ion implant concentration which is sufficient to increase electrical gate oxide thickness only in the overlap region, the ions being implanted at a tilt angle non-orthogonal to the plane of the semiconductor substrate; and completing the fabrication of the semiconductor substrate.

An object of the present invention is to provide a method of reducing gate induced drain leakage current by selectively increasing the electrical gate oxide thickness only in the gate/drain overlap region during the fabrication of integrated circuits.

Another object of the invention is to provide a manufacturable method for fabricating integrated circuits which will result in reduced gate induced drain leakage.

Other objects, features and advantages will appear more fully in the course of the following discussion.

BRIEF DESCRIPTION OF THE DRAWINGS

The same reference numerals refer to the same parts through the various figure embodiments.

DESCRIPTION OF THE PREFERRED EMBODIMENTS

Figure 1:
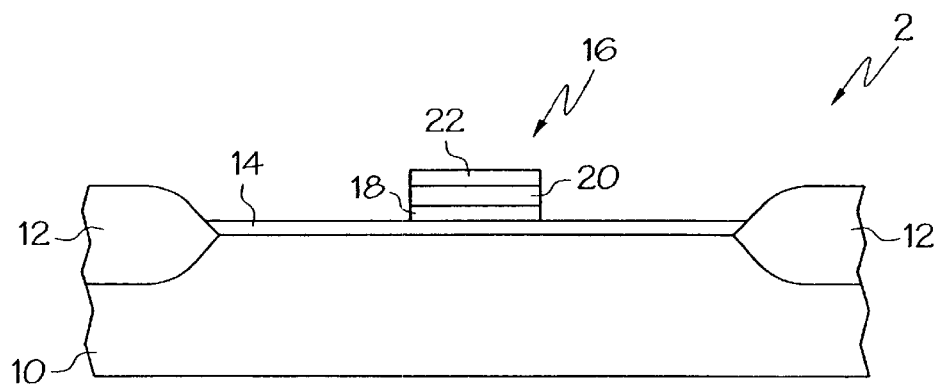
FIG. 1, schematically illustrates in cross-sectional representation a partially completed FET circuit device formed on a semiconductor substrate by conventional processes of the prior art.

FIG. 1 is an illustration of a portion of a partially completed FET device 2, which can be formed by any known conventional method. As an example, and generally speaking, the FET device 2 is manufactured by the known local oxidation of silicon (LOCOS) process where portions of a semiconductor layer or substrate 10, through a lithographic mask, are oxidized to form field isolation regions 12. Field isolation regions 12 define active device regions and provide lateral isolation between adjacent devices also formed by the same mask in and on the surface of the substrate 10. For the sake of clarity, the field isolation regions 12 between devices have been only partially shown. Additionally, the formation of the lithographic mask is done by conventional lithography and etching techniques. It is to be appreciated that substrate 10 may be one or more semiconductor layers or structures, which includes active and operable portions of semiconductor devices, of various dopant concentrations, either dopant polarity, and various crystallographic orientations, but preferably, the present invention is practiced upon a silicon structure having a 100 crystallographic orientation. Further, since the disclosure applies equally well to both N and P surface-channel devices, for brevity we present the case of N-MOSFET devices only. The process is analogous for P-MOSFET. Accordingly, the substrate 10 is p-doped, meaning that the primary carriers of the substrate 10 are "positive" holes. In P-MOSFET devices, the first conductivity type is "negative" due to the n-doped substrate having electrons as the primary carriers.

After forming the isolation regions 12, a dielectric layer or gate oxide layer 14 is formed upon the cleaned active device regions of the substrate 10 by thermal oxidation, as is conventional in the art. Next, a gate electrode 16 comprised of an in-situ doped polysilicon layer 18 is deposited upon the gate oxide layer 14 by a known method such as low pressure chemical vapor deposition (LPCVD), plasma enhanced chemical vapor deposition (PECVD), or physical vapor deposition (PVD). The polysilicon layer 18 is etched, as is conventional in the art, to provide a desired pattern for the gate electrode 16 within the active region of the substrate 10. Although the thickness of the gate oxide layer 14 is preferably about 20 Å to about 80 Å, because gate oxide thickness ($t_{ox}$) depends on its technology node, it is believed that the method of the present invention is useful with any technology node where thinner gate oxides layers are required. Additionally, and also dependent on the technology node, for the preferred embodiment of the present invention, the total thickness of the polysilicon layer 18 and the gate electrode 16 patterned from the highly doped polysilicon layer is preferably about 200 Å to about 1000 Å.

Generally, although not necessary for the practice of the invention, further materials may be deposited to form additional material layers upon the polysilicon layer 18 of the gate electrode 16. The typical materials of these layers include metals, metal alloys, highly doped polysilicon, suicides, and polycides (polysilicon/metal suicide stacks), which are used with the purpose to improve the electrical characteristics of the device. In a preferred embodiment, a relatively thin layer of titanium nitride (TiN) is deposited on the polysilicon layer 18 to form a barrier layer 20. The barrier layer 20 is then blanketed with a tungsten (W) layer 22 to complete the formation of the gate electrode 16.

Figure 2A:
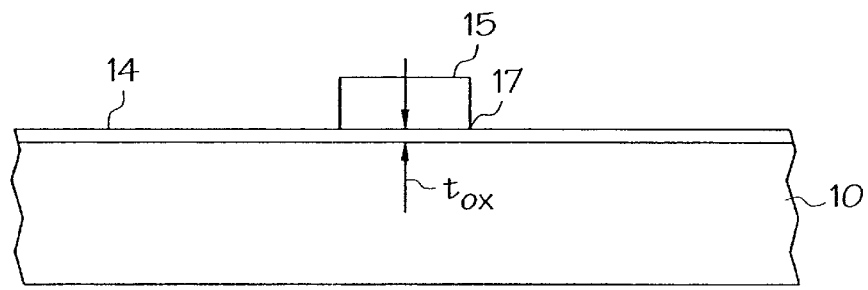
FIGS. 2a through 2c illustrate process steps in fabricating a gate structure in accordance with an aspect of the present invention.
Figure 2B:
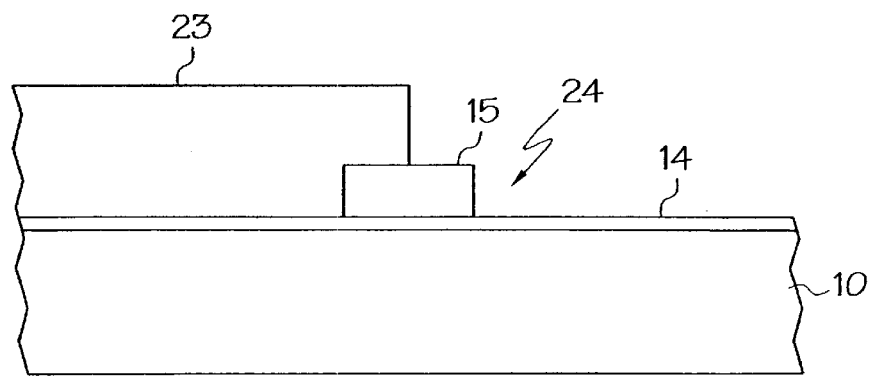
Figure 2C:
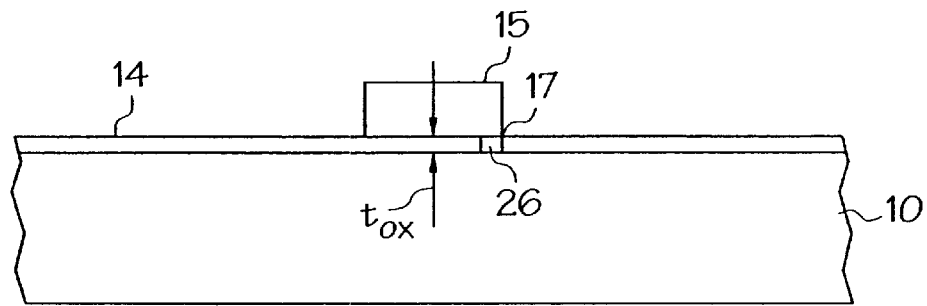

As seen in FIGS. 2a through 2c, which generally illustrate the process steps in fabricating a gate structure in accordance with an aspect of the present invention, the gate oxide layer 14 is grown on the semiconductive substrate 10, preferably a silicon substrate, by thermal oxidation. A polysilicon layer is deposited on the oxide layer 14, and patterned using a photoetching process to form a gate structure 15. The surface of the gate structure 15 which contacts the gate oxide 14 has a leading edge 17. Next, as shown in FIG. 2b, a photoresist layer 23 is provided over the surface of the substrate 10 and patterned to expose a portion of both the oxide layer 14 and the gate structure 15. Implanting with an angled, high dose, low energy, ion implant 24 is conducted with conventional equipment to selectively dope with ions at an overlap region 26 of the oxide layer 14.

As shown in FIG. 2c, the overlap region 26 is beneath the gate structure 15 adjacent its leading edge 17. The ion implant 24 is preferably fluorine, and alternatively, may be chlorine or any other ion that lowers the dielectric constant of the oxide layer 14. In the preferred embodiment, the fluorine ions are implanted at: (1) a tilt angle of from about 5 to about 15 degrees from an axis orthogonal to the plane of the substrate 10, (2) an ion implantation dose of from about $1 \times 10^{13}$ to about $1 \times 10^{14}$ atoms per square centimeter, and (3) an ion implantation energy of from about 10 KeV to about 20 KeV. Although, the preferred range to the angle of ion implantation is about 5 degrees to about 15 degrees, it is to be appreciated that the ion implant angle depends on the stack height of the gate structure 15. It is to be appreciated that implanting of the fluorine ion implant 24 is tailored to attain a preferred ion concentration of about $1 \times 10^{18}$ atoms per cubic centimeter beneath the gate structure 15 at the overlap region 26. Doping the overlap region 26 to this preferred concentration selectively alters (lowers) the dielectric constant of the gate oxide layer 14 near the overlap region.

As shown in FIG. 2c, with the photoresist layer 23 removed, doping to the preferred ion concentration increases the "electrical gate oxide" thickness in the overlap region 26 without physically growing or increasing $t_{ox}$ of the oxide layer 14 as in prior art methods. Accordingly, with the gate structure formed by the present invention, further fabrication of the semiconductive substrate 10 may continue to complete circuit devices.

Figure 3A:
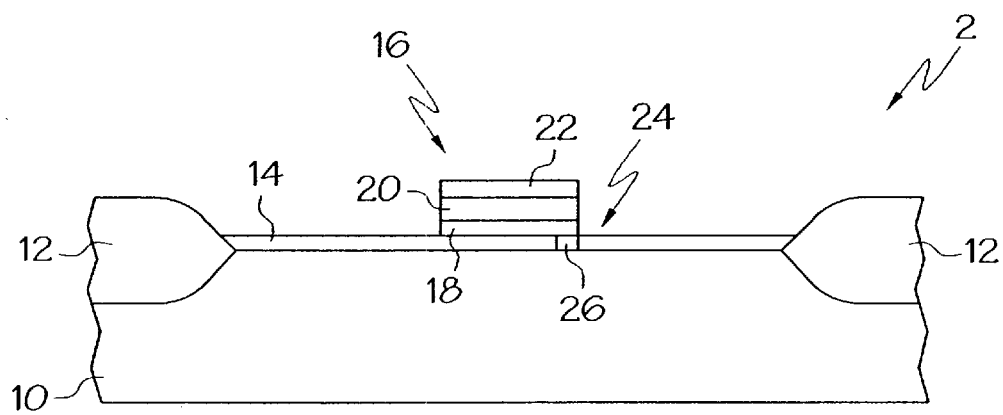
FIGS. 3a through 3e, schematically illustrate a series of cross-sectional representations which illustrate the progressive stages in completing the fabrication of a FET device in accordance with a process of the present invention.

One such device that can be formed by the processes of the present invention is a field effect transistor. The fabrication of the FET device is shown by FIGS. 3a through 3d which schematically illustrated a series of cross-sectional representations of the progressive stages. FIG. 3a starts with the partially completed FET device 2, formed in accordance with (but not necessarily) the prior art methods discussed in regards to FIG. 1. Prior to conducting ion implanting of the ion implant 24 at the overlap region 26, as previously explained above with regards to FIGS. 2a through 2c, a short reoxidation is performed on the substrate 10. Several methods may be used to reoxidize or anneal the semiconductor substrate 10 including but not limited to thermal methods, Rapid Thermal Processing (RTP) methods, and laser assisted processing methods. For the preferred embodiment of the present invention, the substrate 10 is annealed through a thermal method at a temperature of about 800 to about 900 degrees centigrade for a time period of about 10 to about 15 minutes.

After the above short reoxidation period, ion implanting of the ion implant 24 is conducted with conventional equipment to selectively dope with ions at the overlap region 26 of the gate-oxide layer 14 and the polysilicon layer 18 of the gate electrode 16. As before, the ion implant 24 is preferably fluorine, and alternatively, may be chlorine or any other ion that lowers the dielectric constant of the gate oxide layer 14. Additionally, what is important is that for a typical FET device 2, the preferred implanting of the fluorine ion implant 24 is tailored to attain an ion concentration of about $1 \times 10^{18}$ atoms per cubic centimeter at the gate-poly/gate-oxide interface beneath gate electrode 16 adjacent the drain region 30b. Doping the gate-drain overlap region 26 to this preferred concentration selectively alters (lowers) the dielectric constant of the gate oxide layer 14 near the overlap region 26, and thus increases the "electrical gate oxide" thickness in the overlap region 26 without physically growing a thicker gate oxide layer 24 as in prior art methods.

Figure 3B:
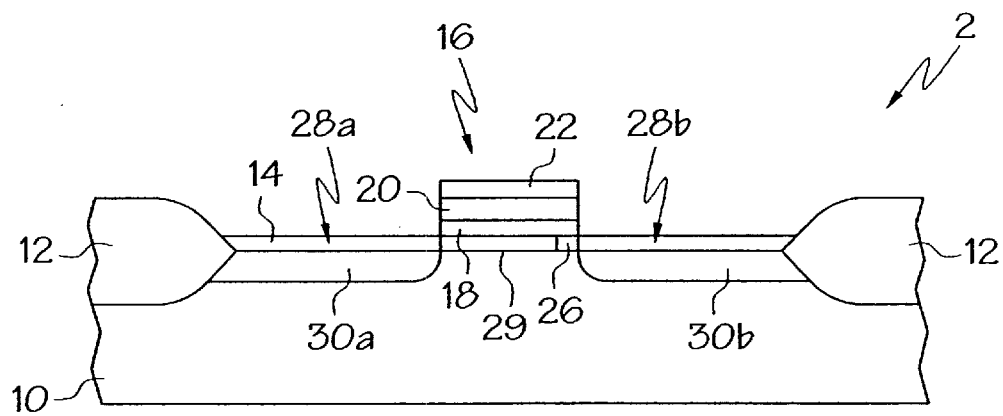
Figure 3C:
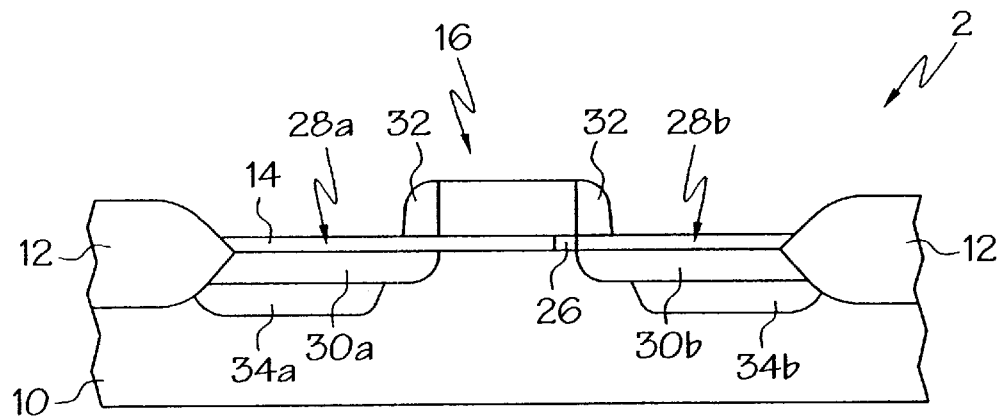
Figure 3D:
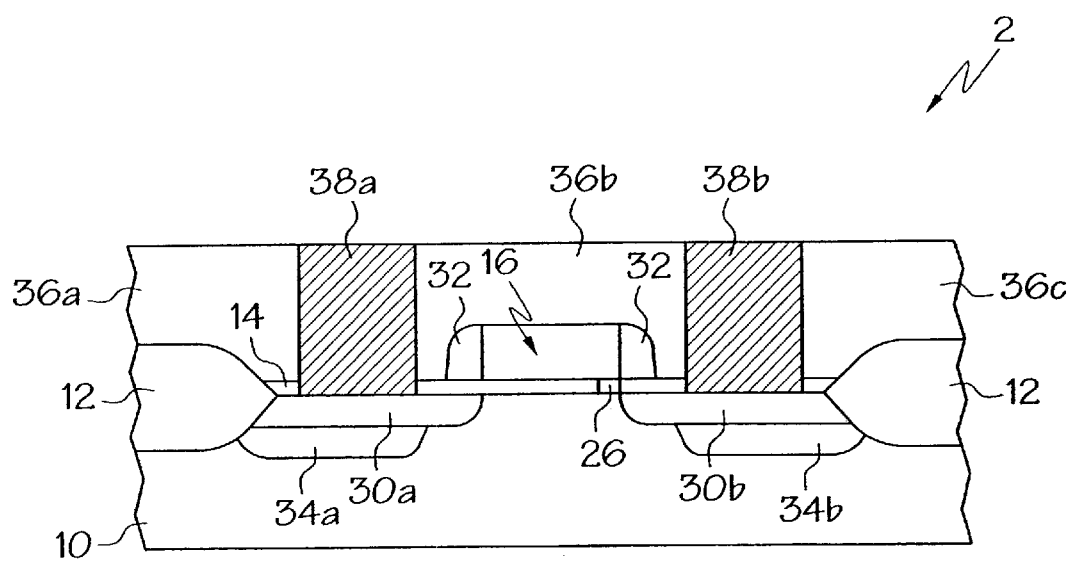

As illustrated in FIGS. 3b through 3d, the remainder of the fabrication steps continue in any conventional manner after the above described ion implantation step of FIG. 3a to complete the FET device 2. As shown by FIG. 3b, further provided on the FET device 2, adjacent both sides of the gate electrode 16 and extending to the field isolation regions 12, are impurity diffusion regions consisting of a source region 28a and drain region 28b. The edges of source/drain regions 28a and 28b adjacent the gate electrode 16 define a channel region 29 at the surface of the substrate 10. The source/drain regions 28a and 28b are typically formed in a two-stage implantation process with an impurity dopant material to form a lightly doped drain (LDD) and then a heavily doped drain (HDD). If the impurity dopant material used for forming the source/drain regions 28a and 28b is n-type, where electrons are used in the source/drain regions as the primary carriers, then the resulting MOSFET is an N-MOSFET ("n-channel") transistor device. For example, arsenic or phosphorus at a dose of between about $2 \times 10^{15}$ to about $5 \times 10$ atoms per square centimeter and with an energy of between about 5 KeV to about 15 KeV may be used to produce the n-channel doped drain 28a and 28b. Conversely, if the source/drain dopant material is p-type, where holes in the source and drain regions are used as the primary carriers, then the resulting MOSFET is a P-MOSFET ("p-channel") transistor device. For example, boron di-flouride at a dose of between about $2 \times 10^{15}$ to about $5 \times 10^{15}$ atoms per squared centimeter and with an energy of between about 10 KeV to about 25 KeV may be used to produce the p-channel doped drain 28a and 28b. If FET device 2 is formed with a combination of n-channel and p-channel transistors on the same substrate 10, then the resulting MOSFET is a complementary FET (CMOS), and may comprise of a plurality of N-MOSFETs and a plurality of complimentary P-MOSFETs on the same substrate 10.

In forming the source/drain regions 28a and 28b, a first ion implantation is made using the gate electrode 16 and the field isolation regions 12 to mask the substrate, in order to form the more lightly doped portions of LDD source/drain regions 30a and 30 Gb. Generally, although not necessary for the practice if the invention, as shown by FIG. 3c, provided on both sides of the gate electrode 16 are electrode spacers 32. The electrode spacers 32 may be formed from materials including but not limited to insulating materials such as silicon oxides, silicon nitrides and silicon oxynitrides. Various processes are used to form electrode spacers 32. Such processes include Reactive Ion Etch (RIB), and the above mentioned material deposition methods. Typically, electrode spacers 32 are formed by depositing an oxide film, such as tetraethoxysilane (TEOS) oxide at between about 600 to about 720 degrees centigrade to a thickness of between about 300 Å to about 700 Å. A second ion implantation is performed to complete the source/drain regions 28a and 28b with HDD source/drain regions 34a and 34b. In the illustrated FET device 2, the source/drain regions 28a and 28b may be doped with any n-type or p-type dopant or combinations of different n-type dopants or p-type dopants might be used to achieve different diffusion profiles. Further, it is to be appreciated that the angled ion implantation step of the present invention, if desired, could be carried out at this stage in the fabrication of the FET device 2, as there are no apparent advantages or disadvantage in performing this step before or after the formation of either the LDD, the spacers, or even the HDD.

Subsequent to forming the source/drain regions 28a and 28b into substrate 10, substrate 10 is once again annealed to recrystallize the source/drain regions 24a and 24b. As before, the annealing of the source/drain regions 28a and 28b may also be accomplished through thermal methods, Rapid Thermal Processing (RTP) methods, and laser assisted methods. For the preferred embodiment of the present invention, the semiconductor substrate is annealed RTP at a temperature of about 800 to about 1000 degrees centigrade and a time period of about 10 seconds to about 20 seconds to form the recrystallized source/drain regions 28a and 28b.

Referring now to FIG. 3d, there is shown a cross-sectional schematic diagram illustrating the last series of process steps in forming a FET in accord with the preferred embodiment of the present invention. Shown in FIG. 3d are patterned interlevel dielectric layers 36a, 36b and 36c. Patterned interlevel dielectric layers 36a, 36b and 36c are formed by patterning through photolithographic and etching methods as are known in the art of a blanket interlevel dielectric layer formed upon the substrate 10. Blanket interlevel dielectric layers may be formed from insulating materials including but not limited to silicon oxides, silicon nitrides and silicon oxynitrides. These insulating layers may be formed upon semiconductor substrates through methods including but not limited to Chemical Vapor Deposition (CVD) methods, Plasma Enhanced Chemical Vapor Deposition (PECVD) methods and Physical Vapor Deposition (PVD) methods.

For the preferred embodiment of the present invention, the patterned interlevel dielectric layers 36a, 36b and 36c are formed through patterning via photolithographic and etching methods as are known in the art of a blanket interlevel dielectric layer formed from a silicon oxide material deposited upon the substrate 10 through a Chemical Vapor Deposition (CVD) process employing Tetra Ethyl Ortho Silicate (TEOS) as the source material. Although insulating layers formed through other methods and materials may also be employed, the preferred method and material provide a simple and well known process conventional in the art. The bottoms of the apertures between the patterned interlevel dielectric layers 36a and 36b and the patterned interlevel dielectric layers 36b and 36c are etched through the gate oxide layer 14 to expose surfaces of the source/drain regions 28a and 28b, respectively. Conductive contact studs 38a and 38b, which are formed respectively into the apertures between the patterned interlevel dielectric layers 36a and 36b and the patterned interlevel dielectric layers 36b and 36c, contact the exposed surfaces of the source/drain regions 28a and 28b, respectively. The conductive contact studs 38a and 38b are conventional to the art and may be formed from conductive materials including but not limited to metals, metal alloys and polysilicon deposited upon a semiconductor substrate through methods including, but not limited to, thermal evaporation methods, electron beam assisted evaporation methods, and CVD methods. For the preferred embodiment of the present invention, the conductive contact studs 38a and 38b are preferably formed from a thin titanium nitride barrier layer of thickness from about 200 to about 1000 angstroms upon which is formed a thicker conductive tungsten layer. The tungsten layer is of sufficient thickness to completely fill the apertures within the interlevel dielectric layers 36a, 36b and 36c.

Upon forming the conductive contact studs 38a and 38b within the patterned interlevel dielectric layers 36a, 36b and 36c, there is formed an FET device 2 of the preferred embodiment of the present invention within an integrated circuit, which has a reduced GIDL over conventional FET devices of similar design. It is to be appreciated that the method of the present invention has advantages over prior art methods in that it reduces GIDL currents without compromising other device characteristics like sub-vt and drives. Accordingly, the new electrical flow produced by the application of the method of the present invention allows reduction of gate oxide thickness per scaling rules for deep submicron geometries. Accordingly, the process of the invention can be used in any double (or more) polysilicon process for making such integrated circuit devices as DRAM, SRAM, EPROM, ASIC or the like.

Figure 3E:
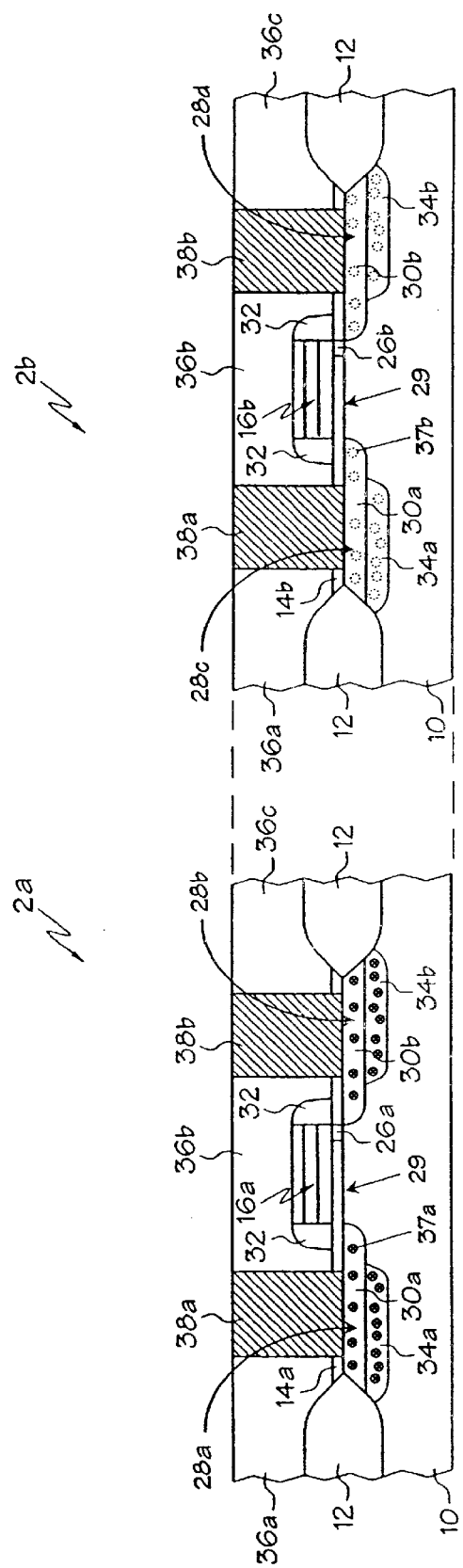

For example, FIG. 3e illustrates a circuit structure comprising a semiconductor layer 10 and a first dopant-type MOS transistor 2a situated on the semiconductor layer 10 having a source region 28a and a drain region 28b in the semiconductor layer 10 which are doped with a first conductivity-type dopant 37a, a channel region 29 located between the source/drain regions 28a and 28b, a gate oxide layer 14a located on a surface of the channel region 29, and a gate electrode 16a located on the gate oxide layer 14a. The portion of the gate oxide layer 14a, which is beneath the gate electrode 16a and adjacent the drain region 28b and which defines an overlap region 26a, has an ion implant concentration which is effective to lower the surface electrical field in the overlap region 26a. A second-type dopant MOS transistor 2b, which is complementary to the first dopant-type MOS transistor 2a, is situated on the semiconductor layer 10 and includes a second gate oxide layer 14b, two complementary source/drain regions 28c and 28d, which are doped with a second conductivity-type dopant 37b, and a complementary gate electrode 16b located on the second gate oxide layer 14b. Additionally, a portion of the second gate oxide layer 14b, which is beneath the complimentary gate electrode 16b and adjacent the complimentary drain region 28d and which defines a second overlap region 26b, has an ion implant concentration which is effective to lower the surface electrical field in the second overlap region 26b. Preferably, the ion implant concentration is about $1\times10^{18}$ atoms per cubic centimeter of fluorine.

Having thus described the present invention in detail and by reference to preferred embodiments thereof, it will be apparent that modifications and variations are possible without departing from the scope of the invention detailed in the appended claims.

What is claimed is:

1. A method for fabricating a structure on a semiconductor layer comprising:

forming an oxide layer on a semiconductor layer;

forming a polysilicon layer on said oxide layer;

patterning said polysilicon layer into a gate structure having first and second leading edges, and to expose said oxide layer; and implanting ions into said oxide layer beneath said gate structure adjacent said first leading edge and inward of said second leading edge, thereby defining an overlap region under said gate structure, to a predetermined ion implant concentration which is higher in concentration than remaining oxide layer portions that extend outwardly passed said first and second leading edges adjacently from said overlap region, and which is sufficient to increase the electrical gate oxide thickness only in said overlap region, said ions are implanted at a tilt angle non-orthogonal to the plane of said semiconductor layer.

2. A method according to claim 1, wherein said predetermined ion implant concentration is about $1\times10^{18}$ atoms per cubic centimeter of fluorine.

3. A method according to claim 1, wherein the tilt angle is about 5 to about 15 degrees from an axis orthogonal to the plane of the semiconductor layer.

4. A method according to claim 1, wherein at least one of said ions is selected from the group consisting of fluorine and chlorine.

5. A method according to claim 1, wherein at least one of said ions is fluorine and said implanting is carried out at an ion implantation dose of from about 1×10$^{13}$ to about 1×10$^{14}$ atoms per square centimeter, and an ion implantation energy of from about 10 KeV to about 20 KeV.

6. A method according to claim 1, further including annealing said semiconductor layer at a temperature of about 800 to about 900 degrees centigrade for a time period of about 10 to about 15 minutes.

7. A method according to claim 1, wherein said oxide layer thickness is about 20 to about 80 angstroms.

8. A method according to claim 1, further comprising forming electrode spacers on both sides of said gate structure.

9. A method according to claim 1, wherein said gate structure is comprised of polysilicon.

10. A method according to claim 1, wherein said gate structure is a gate stack.

11. A method according to claim 10, wherein said gate stack is comprised of a layer of polysilicon, and additional layers selected from the group consisting of metals, metal alloys, highly doped polysilicon, suicides, and polycides (polysilicon/metal suicide stacks).

12. A method according to claim 1, wherein said gate structure is a gate electrode comprised of a layer of polysilicon, a layer of titanium nitride deposited on top of said polysilicon layer, and a layer of tungsten deposited on top of said titanium layer.

13. A method according to claim 1, wherein said oxide layer is formed by low pressure chemical vapor deposition to a thickness of about 20 to about 80 Angstroms.

14. A method according to claim 1, further comprising forming lightly doped drain source/drain regions within the semiconductor layer adjoining said gate structure.

15. A method according to claim 14, wherein the lightly doped regions are n-type regions formed by implanting ions, selected from the group consisting of phosphorus and arsenic, with a dosage of between about 2×10$^{15}$ to about 5×10$^{15}$ atoms per centimeter squared at an energy of between about 5 to about 15 KeV.

16. A method according to claim 14, wherein the lightly doped regions are p-type regions formed by implanting boron di-fluoride ions with a dosage of between about 2×10$^{15}$ to about 5×10$^{15}$ atoms per centimeter squared at an energy of between about 10 to about 25 KeV.

17. A method according to claim 1, further comprising forming heavily doped drain source/drain regions within the semiconductor layer adjoining the gate structure.

18. A method according to claim 17, wherein the heavily doped regions are n-type regions formed by implanting ions, selected from the group consisting of phosphorus and arsenic, with a dosage of about 2×10$^{15}$ to about 5×10$^{15}$ atoms per centimeter squared at an energy of between about 5 to about 15 KeV.

19. A method according to claim 17, wherein the heavily doped regions are p-type regions formed by implanting boron di-fluoride ions with a dosage of between about 2×10$^{15}$ to about 5×10$^{15}$ atoms per centimeter squared at an energy of between about 10 to about 25 KeV.

20. A method according to claim 8, wherein said electrode spacers have widths of about 300 to about 700 Angstroms.

21. A method according to claim 1, wherein said implanting is performed before said forming said polysilicon layer.

22. A method according to claim 1, wherein said implanting is performed before said patterning said polysilicon layer.

23. A method of reducing Gate Induced Drain Leakage (GIDL) current within Field Effect Transistors (FETs) comprising:

forming on a semiconductor layer a field effect transistor structure comprising a gate oxide layer, a gate electrode having first and second leading edges on the gate oxide layer and two source/drain regions formed within said semiconductor layer adjacent said first and second leading edges;

annealing said semiconductor layer;

implanting ions into said gate oxide layer beneath said gate electrode and adjacent said first leading edge and inward of said second leading edge, which defines an overlap region under said gate electrode, to a predetermined ion implant concentration which is higher in concentration than remaining gate oxide layer portions that extend outwardly passed said first and second leading edges adjacently from said overlap region, which is sufficient to increase electrical gate oxide thickness only in said overlap region, said ions being implanted at a tilt angle non-orthogonal to the plane of the semiconductor layer; and completing the fabrication of said semiconductor layer.

24. A method according to claim 23, wherein said FET formed on said semiconductor layer is a plurality of a first FET with a first dopant type and said semiconductor layer also includes a plurality of a second FET with a second dopant type, said second FET being complimentary to said first FET.

25. A method according to claim 23, wherein said ion implant concentration is about 1×10$^{18}$ atoms per cubic centimeter of fluorine.

26. A method according to claim 23, wherein the tilt angle is from about 5 to about 15 degrees from an axis orthogonal to the plane of the semiconductor layer.

27. A method according to claim 23, wherein at least one said ions is selected from the group consisting of fluorine and chlorine.

28. A method according to claim 23, wherein at least one said ions is fluorine and said implanting is carried out at an ion implantation dose of from about 1×10$^{13}$ to about 1×10$^{14}$ atoms per square centimeter, and an ion implantation energy of from about 10 KeV to about 20 KeV.

29. A method according to claim 23, wherein said annealing is at a temperature of about 800 to about 1000 degrees centigrade for a time period of about 10 to about 20 seconds.

30. A method for fabricating a structure on a semiconductor layer comprising:

forming an oxide layer on a semiconductor layer;

forming a polysilicon layer on said oxide layer;

patterning said polysilicon layer into a gate structure having first and second leading edges, and to expose said oxide layer; and implanting ions into said oxide layer at an overlap region beneath said gate structure and adjacent said first leading edge and inward of said second leading edge to a predetermined ion implant concentration higher than remaining oxide layer portions that extend outwardly passed said first and second leading edges adjacently from said overlap region, which is sufficient to increase the electrical gate oxide thickness only in said overlap region, said ions are implanted at a tilt angle non-orthogonal to the plane of said semiconductor layer, said implanting is carried out at an ion implantation dose of about 1×10$^{13}$ to about 1×10$^{14}$ atoms per square centimeter, an ion implantation energy of from about 10 KeV to about 20 KeV, and at least one of said ions is fluorine.

31. A method for fabricating a structure on a semiconductor layer comprising:

forming an oxide layer on a semiconductor layer;

forming a polysilicon layer on said oxide layer;

patterning said polysilicon layer into a gate structure having first and second leading edges, and to expose said oxide layer;

implanting ions into said oxide layer at an overlap region beneath said gate structure and adjacent said first leading edge and inward of said second leading edge to a predetermined ion implant concentration hither than remaining oxide layer portions that extend outwardly passed said first and second leading edges adjacently from said overlap region, which is sufficient to increase the electrical gate oxide thickness only in said overlap region, said ions are implanted at a tilt angle non-orthogonal to the plane of said semiconductor layer; and forming a lightly doped drain source/drain regions within the semiconductor layer adjoining said gate structure, the lightly doped regions are n-type regions formed by implanting ions, selected from the group consisting of phosphorus and arsenic, with a dosage of between about $2\times10^{15}$ to about $5\times10^{15}$ atoms per centimeter squared at an energy of between about 5 to about 15 KeV.

32. A method for fabricating a structure on a semiconductor layer comprising:

forming an oxide layer on a semiconductor layer;

forming a polysilicon layer on said oxide layer;

patterning said polysilicon layer into a gate structure having first and second leading edges, and to expose said oxide layer;

implanting ions into said oxide layer at an overlap region beneath said gate structure and adjacent said first leading edge and inward of said second leading edge to a predetermined ion implant concentration higher than remaining oxide layer portions that extend outwardly passed said first and second leading edges adjacently from said overlap region, which is sufficient to increase the electrical gate oxide thickness only in said overlap region, said ions are implanted at a tilt angle non-orthogonal to the plane of said semiconductor layer; and forming a lightly doped drain source/drain regions within the semiconductor layer adjoining said gate structure, the lightly doped regions are p-type regions formed by implanting boron di-fluoride ions with a dosage of between about $2\times10^{15}$ to about $5\times10^{15}$ atoms per centimeter squared at an energy of between about 10 to about 25 KeV.

33. A method for fabricating a structure on a semiconductor layer comprising:

forming an oxide layer on a semiconductor layer; forming a polysilicon layer on said oxide layer;

patterning said polysilicon layer into a gate structure having first and second leading edges, and to expose said oxide layer;

implanting ions into said oxide layer at an overlap region beneath said gate structure and adjacent said first leading edge and inward of said second leading edge to a predetermined ion implant concentration hither than remaining oxide layer portions that extend outwardly passed said first and second leading edges adjacently from said overlap region, which is sufficient to increase the electrical gate oxide thickness only in said overlap region, said ions are implanted at a tilt angle non-orthogonal to the plane of said semiconductor layer; and forming a heavily doped drain source/drain regions within the semiconductor layer adjoining the gate structure, wherein the heavily doped regions are n-type regions formed by implanting ions, selected from the group consisting of phosphorus and arsenic, with a dosage of about $2\times10^{15}$ to about $5\times10^{15}$ atoms per centimeter squared at an energy of between about 5 to about 15 KeV.

34. A method for fabricating a structure on a semiconductor layer comprising:

forming an oxide layer on a semiconductor layer; forming a polysilicon layer on said oxide layer;

patterning said polysilicon layer into a gate structure having first and second leading edges, and to expose said oxide layer;

implanting ions into said oxide layer at an overlap region beneath said gate structure and adjacent said first leading edge and inward of said second leading edge to a predetermined ion implant concentration higher than remaining oxide layer portions that extend outwardly passed said first and second leading edges adjacently from said overlap region, which is sufficient to increase the electrical gate oxide thickness only in said overlap region, said ions are implanted at a tilt angle non-orthogonal to the plane of said semiconductor layer; and forming a heavily doped drain source/drain regions within the semiconductor layer adjoining the gate structure, the heavily doped regions are p-type regions formed by implanting boron di-fluoride ions with a dosage of between about $2\times10^{15}$ to about $5\times10^{15}$ atoms per centimeter squared at an energy of between about 10 to about 25 KeV.

35. A method of reducing Gate Induced Drain Leakage (GIDL) current within Field Effect Transistors (FETs) comprising:

forming on a semiconductor layer a field effect transistor structure comprising a gate oxide layer, a gate electrode having first and second leading edges on the gate oxide layer and two source/drain regions formed within said semiconductor layer;

annealing said semiconductor layer;

implanting ions into said gate oxide layer beneath said gate electrode and adjacent said first leading edge and inward of said second leading edge, which defines an overlap region under the gate electrode, to a predetermined ion implant concentration higher than remaining gate oxide layer portions that extend outwardly passed said first and second leading edges adjacently from said overlap region, which is sufficient to increase electrical gate oxide thickness only in said overlap region, said ions being implanted at a tilt angle non-orthogonal to the plane of the semiconductor layer, at least one said ions is fluorine and said implanting step is carried out at an ion implantation dose of about $1\times10^{13}$ to about $1\times10^{14}$ atoms per square centimeter, and an ion implantation energy of from about 10 KeV to about 20 KeV; and completing the fabrication of said semiconductor layer.

36. A method for fabricating a structure on a semiconductor layer comprising:

forming an oxide layer on a semiconductor layer;

forming a polysilicon layer on said oxide layer;

patterning said polysilicon layer into a gate structure having first and second leading edges, and to expose at least portions of said oxide layer adjacent said first and second leading edges;

providing a resist layer which exposes a portion of said gate structure and at least a portion of said oxide layer adjacent said first leading edge; and implanting ions into said oxide layer beneath said gate structure adjacent said first leading edge and inward of said second leading edge, thereby defining an overlap region under said gate structure, to a predetermined ion implant concentration which is higher in concentration than remaining oxide layer portions that extend outwardly passed said first and second leading edges adjacently from said overlap region, and which is sufficient to increase the electrical gate oxide thickness only in said overlap region, said ions are implanted at a tilt angle non-orthogonal to the plane of said semiconductor layer.

* * * * *

UNITED STATES PATENT AND TRADEMARK OFFICE
CERTIFICATE OF CORRECTION

PATENT NO. : 6,693,012 B2
DATED : Febuary 17, 2004
INVENTOR(S) : Mouli et al.

It is certified that error appears in the above-identified patent and that said Letters Patent is hereby corrected as shown below:

Column 4,
Line 42, "suicides" should read as -- silicides --

Column 6,
Line 15, "5x10" should read as -- $5x10^{15}$ --
Line 35, "30 Gb" should read as -- 30b --

Column 9,
Line 20, "suicides." should read as -- silicides, --
Line 21, "suicide" should read as -- silicide --

Column 11,
Lines 23 and 64, "hither" should read as -- higher --

Signed and Sealed this

Twenty-seventh Day of July, 2004

JON W. DUDAS
*Acting Director of the United States Patent and Trademark Office*